(12) United States Patent
Kenzaki et al.

(10) Patent No.: US 10,948,519 B2
(45) Date of Patent: Mar. 16, 2021

(54) PROBE

(71) Applicant: Murata Manufacturing Co., Ltd., Kyoto-fu (JP)

(72) Inventors: Shinichi Kenzaki, Nagaokakyo (JP); Yukihiro Kitaichi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 122 days.

(21) Appl. No.: 16/247,220

(22) Filed: Jan. 14, 2019

(65) Prior Publication Data
US 2019/0250189 A1 Aug. 15, 2019

(30) Foreign Application Priority Data
Feb. 9, 2018 (JP) .............................. JP2018-022217

(51) Int. Cl.
*G01R 1/04* (2006.01)
*G01R 1/067* (2006.01)
*G01R 31/02* (2006.01)
*G01R 31/20* (2006.01)
*G01R 31/68* (2020.01)

(52) U.S. Cl.
CPC ......... *G01R 1/06722* (2013.01); *G01R 31/68* (2020.01)

(58) Field of Classification Search
CPC .. G01R 1/0416; G01R 1/067; G01R 1/06722; G01R 1/073; G01R 31/02; G01R 31/04; G01R 31/20; G01R 31/28; G01R 31/2889; G01R 31/69
See application file for complete search history.

(56) References Cited

U.S. PATENT DOCUMENTS 4,580,862 A 4/1986 Johnson
4,649,916 A * 3/1987 Frimberger ....... A61M 25/0097
606/1

(Continued)

FOREIGN PATENT DOCUMENTS

JP S60-218777 11/1985
JP S62-092475 U 6/1987

(Continued)

OTHER PUBLICATIONS

An Office Action mailed by the Japanese Patent Office dated Jan. 28, 2020, which corresponds to Japanese Patent No. 2018-022217 and is related to U.S. Appl. No. 16/247,220 with English language translation.

(Continued)

*Primary Examiner* — Neel D Shah
(74) *Attorney, Agent, or Firm* — Studebaker & Brackett PC

(57) ABSTRACT

A probe for inspecting characteristics of a terminal of a multipolar connector includes a flange having a through hole and serving to mount the probe to a facility; and a coaxial cable inserted through the through hole of the flange, extending in an axial direction, and having an end portion at which a probe pin is mounted. The probe also includes a plunger containing the probe pin and having a recess for fitting the multipolar connector, with the probe pin being exposed in the recess. The probe further includes a spring containing the coaxial cable between the flange and the plunger and having an end portion fixed to the flange and another end portion fixed to the plunger.

21 Claims, 12 Drawing Sheets

(56) References Cited

U.S. PATENT DOCUMENTS

| | | | |
|---|---|---|---|
| 6,198,297 B1* | 3/2001 | Riccioni | G01R 1/07342 |
| | | | 324/754.07 |
| 2005/0212541 A1* | 9/2005 | Ruff | G01R 1/06788 |
| | | | 324/755.02 |
| 2006/0073723 A1 | 4/2006 | Cowgill et al. | |
| 2013/0112457 A1* | 5/2013 | Kitagawa | A61B 1/0056 |
| | | | 174/68.3 |
| 2015/0285840 A1* | 10/2015 | Matsui | G01R 31/2886 |
| | | | 324/754.14 |
| 2017/0227579 A1* | 8/2017 | Yui | G01R 1/067 |

FOREIGN PATENT DOCUMENTS

| | | |
|---|---|---|
| JP | S63-161366 U | 10/1988 |
| JP | H04-002484 U | 1/1992 |
| JP | 2008-197009 A | 8/2008 |
| TW | 201621323 A | 6/2016 |
| WO | 2016/072193 A1 | 5/2016 |

OTHER PUBLICATIONS

An Office Action; "Notice of Reasons for Refusal," mailed by the Japanese Patent Office dated Sep. 23, 2020, which corresponds to Japanese Patent Application No. 2018-022217 and is related to U.S. Appl. No. 16/247,220 with English language translation.

* cited by examiner

PROBE

CROSS-REFERENCE TO RELATED APPLICATION

This application claims benefit of priority to Japanese Patent Application No. 2018-022217, filed Feb. 9, 2018, the entire content of which is incorporated herein by reference.

BACKGROUND

Technical Field

The present disclosure relates to a probe for inspecting characteristics of a terminal of a multipolar connector.

Background Art

Hitherto, a probe for inspecting characteristics of a terminal of a connector to be inspected has been disclosed in, for example, International Publication No. 2016/072193.

The probe of International Publication No. 2016/072193 is a probe for inspecting characteristics of a coaxial connector, and particularly for inspecting characteristics of a multipolar connector provided with a plurality of terminals such that a plurality of signals flow therethrough. The probe of International Publication No. 2016/072193 includes a plurality of central conductors that are capable of simultaneously coming into contact with the plurality of terminals of the multipolar connector.

For the probe for a connector, improvement of the accuracy of inspecting characteristics of a terminal is required. In the case of simultaneously brining a plurality of central conductors into contact with a plurality of terminals as in the probe of International Publication No. 2016/072193, the accuracy of characteristic inspection is likely to decrease due to positional displacement between the terminals and the central conductors. Development of a technique that allows characteristics of a terminal of a multipolar connector to be more accurately inspected is required.

SUMMARY

Accordingly, the present disclosure provides a probe that is able to more accurately inspect characteristics of a terminal of a multipolar connector.

According to preferred embodiments of the present disclosure, a probe for inspecting characteristics of a terminal of a multipolar connector includes a flange having a through hole and serving to mount the probe to a facility; and a coaxial cable inserted through the through hole, extending in an axial direction, and having an end portion at which a probe pin is mounted. The probe also includes a plunger containing the probe pin and having a recess for fitting the multipolar connector, with the probe pin being exposed in the recess. The probe further includes a spring containing the coaxial cable between the flange and the plunger, and having an end portion fixed to the flange and another end portion fixed to the plunger.

With the probe according to preferred embodiments of the present disclosure, it is possible to more accurately inspect characteristics of a terminal of a multipolar connector.

Other features, elements, characteristics and advantages of the present disclosure will become more apparent from the following detailed description of preferred embodiments of the present disclosure with reference to the attached drawings.

DETAILED DESCRIPTION

Figure 1:
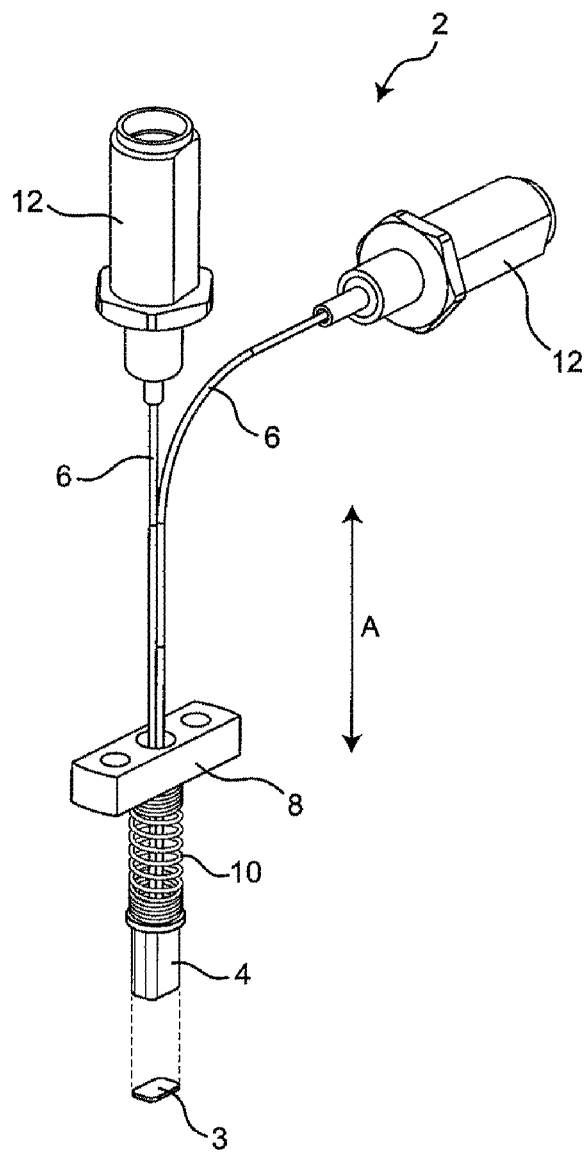
FIG. 1 is a schematic perspective view of a probe according to Embodiment 1.

According to a first aspect of the present disclosure, provided is a probe for inspecting characteristics of a terminal of a multipolar connector. The probe includes a flange having a through hole and serving to mount the probe to a facility; and a coaxial cable inserted through the through hole, extending in an axial direction, and having an end portion at which a probe pin is mounted. The probe also includes a plunger containing the probe pin and having a recess for fitting the multipolar connector, with the probe pin being exposed in the recess. The probe further includes a spring containing the coaxial cable between the flange and the plunger and having an end portion fixed to the flange and another end portion fixed to the plunger.

With such a configuration, when the multipolar connector is fitted to the recess of the plunger, since the spring elastically deforms, it is possible to more accurately align the positions of the terminal of the multipolar connector and the probe pin with each other. Accordingly, it is possible to more accurately inspect the characteristics of the terminal of the multipolar connector.

According to a second aspect of the present disclosure, the probe according to the first aspect is provided in which the coaxial cable has flexural rigidity set to be lower than that of the spring. With such a configuration, when the spring elastically deforms, the coaxial cable easily elastically deforms, and thus elastic deformation of the spring is not disturbed, so that it is possible to more accurately inspect characteristics of the terminal of the multipolar connector.

According to a third aspect of the present disclosure, the probe according to the first aspect or the second aspect is provided which further includes a tubular member containing the coaxial cable, between the spring and the coaxial cable. With such a configuration, since the tubular member is provided, when the spring elastically deforms, it is possible to inhibit the spring from deforming more than necessary.

According to a fourth aspect of the present disclosure, the probe according to the third aspect is provided in which the tubular member is inserted through the through hole so as to be spaced apart from an inner circumferential surface forming the through hole of the flange, and is press-fitted and fixed to the plunger. With such a configuration, since the tubular member is not fixed to the flange, it is possible to ensure a state where the tubular member is movable, and since the tubular member is press-fitted and fixed to the plunger, it is possible to easily arrange the tubular member.

According to a fifth aspect of the present disclosure, the probe according to any one of the first to fourth aspects is provided in which the through hole of the flange has a substantially cylindrical shape having a uniform diameter. With such a configuration, it is possible to more easily form the through hole than in the case with another shape.

According to a sixth aspect of the present disclosure, the probe according to any one of the first to fifth aspects is provided in which the flange further includes a tubular projection portion projecting so as to extend the through hole toward the spring, and the spring is press-fitted and fixed to an outer periphery of the projection portion. With such a configuration, it is possible to fix the flange and the spring to each other with a simpler configuration.

According to a seventh aspect of the present disclosure, the probe according to the sixth aspect is provided in which the projection portion has a substantially cylindrical shape having a uniform inner diameter and a uniform outer diameter. With such a configuration, it is possible to easily form the projection portion as compared to the case with another shape.

According to an eighth aspect of the present disclosure, the probe according to any one of the first to seventh aspects is provided in which, in a non-fitted state where the plunger is not fitted to the multipolar connector, a length of the spring is equal to or larger than a natural length of the spring. With such a configuration, since the spring is equal to or longer than the natural length of the spring in a non-fitted state where the plunger and the multipolar connector are not fitted to each other, it is possible to achieve, for example, a configuration to support the weight of the plunger only by the spring, as compared to a configuration in which the spring is compressed to be shorter than the natural length of the spring.

According to a ninth aspect of the present disclosure, the probe according to any one of the first to eighth aspects is provided in which the spring has close winding portions at both end portions thereof. With such a configuration, it is possible to more firmly fix the spring. In addition, since deformation of both end portions of the spring is suppressed as compared to that of the center portion of the spring, the spring is more easily deformed in a desired direction.

According to a tenth aspect of the present disclosure, the probe according to any one of the first to ninth aspects is provided in which a wall portion of the plunger that forms the recess includes a bottom wall that exposes an end portion of the probe pin, a first side wall that rises from a periphery of the bottom wall, and a second side wall that rises from a periphery of the first side wall and is inclined toward the first side wall so as to be narrower inward. With such a configuration, when the multipolar connector is fitted to the recess of the plunger, it is possible to guide the multipolar connector to the inside of the recess along the second side wall.

Hereinafter, embodiments of the present disclosure will be described in detail with reference to the drawings.

Embodiment 1

Figure 2:
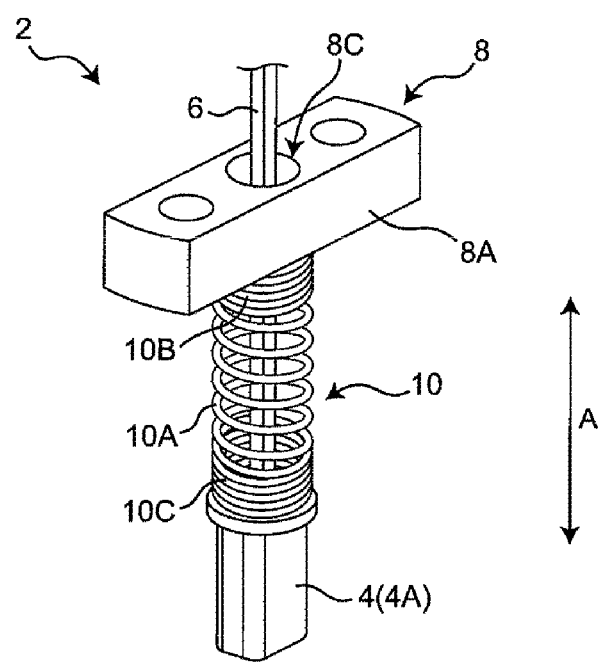
FIG. 2 is a partially enlarged perspective view of the probe in FIG. 1.
Figure 3:
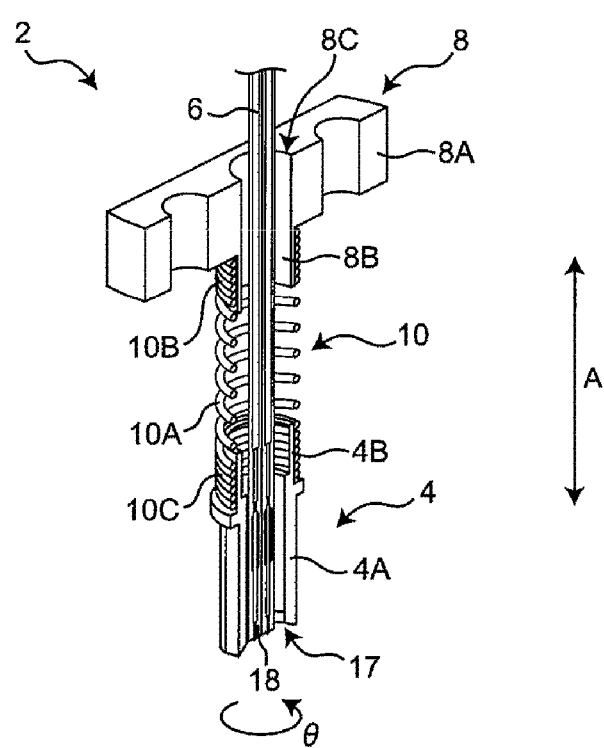
FIG. 3 is a schematic perspective view showing a cross-section of the probe in FIG. 2 taken in the vertical direction.
Figure 4:
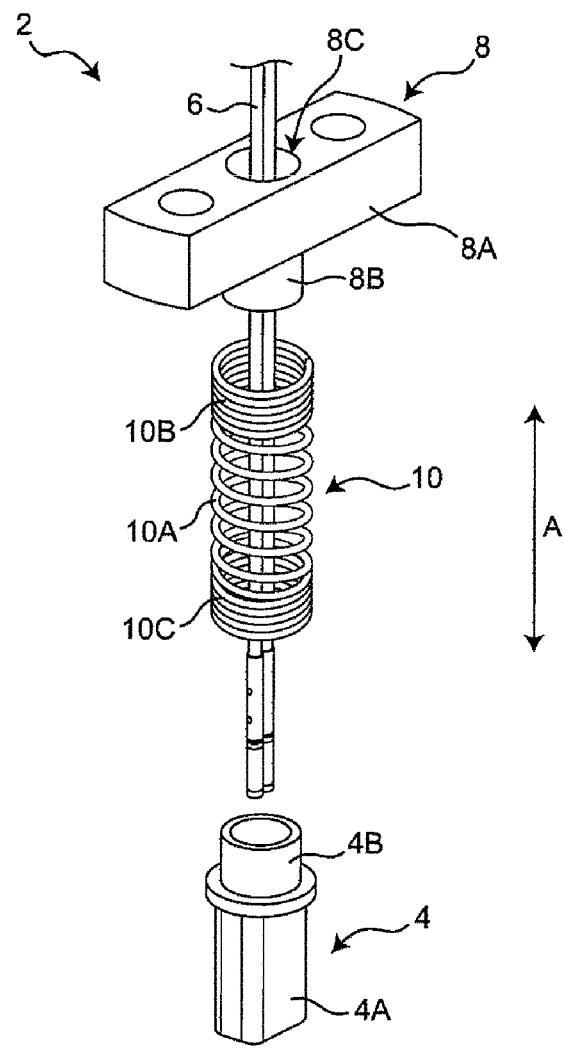
FIG. 4 is a schematic perspective view showing a state before the probe in FIG. 1 is assembled.
Figure 5:
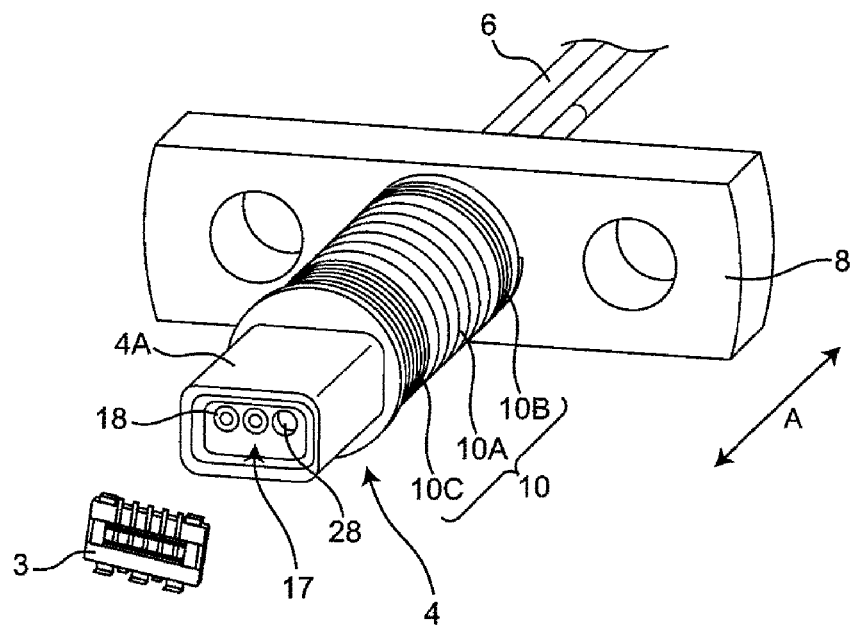
FIG. 5 is a schematic perspective view of the probe as seen from an angle different from those of FIGS. 1 to 4.

FIGS. 1 to 5 are each a diagram showing a schematic configuration of a probe 2 according to Embodiment 1. FIG. 1 is a schematic perspective view of the probe 2, FIG. 2 is a partially enlarged perspective view of FIG. 1, and FIG. 3 is a diagram showing a cross-section of the probe 2 in FIG. 2 taken in the vertical direction. FIG. 4 is a schematic perspective view showing a state before the probe 2 in FIG. 1 is assembled, and FIG. 5 is a partially enlarged perspective view of the probe 2 as seen from an angle different from those of FIGS. 1 to 4.

The probe 2 is an inspection instrument for inspecting characteristics of a multipolar connector 3 (FIG. 1, FIG. 5) having a plurality of terminals. As shown in FIG. 1, etc., the probe 2 includes a plunger 4, coaxial cables 6, a flange 8, a spring 10, measurement connectors 12, and probe pins 18 (FIG. 3, FIG. 4, FIG. 5).

The plunger 4 is a member for fitting to the multipolar connector 3 and positioning the multipolar connector 3. As shown in FIGS. 3 and 4, the plunger 4 is a hollow tubular member. The plunger 4 includes a fitting portion 4A and a connection portion 4B.

The fitting portion 4A is a portion that fits to the multipolar connector 3. A recess 17 is formed on a bottom portion of the fitting portion 4A. The multipolar connector 3 is placed in the recess 17 and fits to the plunger 4. The detailed configuration around the recess 17 will be described later.

The connection portion 4B is a portion that connects to the spring 10 descried later. The connection portion 4B has a substantially cylindrical shape, and the spring 10 is connected to the outer periphery of the connection portion 4B. The connection portion 4B in Embodiment 1 has a substantially cylindrical shape having a uniform inner diameter and a uniform outer diameter.

A plurality of the coaxial cables 6 are inserted through the inside of the spring 10. The coaxial cables 6 are substantially rod-shaped members that are electrically connected to the above-described measurement connectors 12. In Embodiment 1, a mode in which two coaxial cables 6 are provided is illustrated, but the number of coaxial cables 6 is not limited to two. The probe pins 18 are mounted at ends of the coaxial cables 6. The coaxial cables 6 are also electrically connected to the probe pins 18, and each have a function to pass signals between the probe pin 18 and the measurement connector 12.

The flexural rigidity of each coaxial cable 6 in Embodiment 1 is set to a predetermined value k1 in advance. Specifically, the flexural rigidity k1 of each coaxial cable 6 is set to be lower than the flexural rigidity of the spring 10 described later. The flexural rigidity may be measured by any general measurement method.

The coaxial cables 6 are inserted through a through hole 8C of the flange 8. The flange 8 is a member for mounting the probe 2 to a predetermined facility (not shown). An example of the facility is a sorter for sorting a printed circuit board having the multipolar connector 3 mounted thereon, on the basis of a result of characteristic inspection of the multipolar connector 3, but the facility is not limited thereto.

The flange 8 includes a body portion 8A and a projection portion 8B. The body portion 8A is a portion forming a body of the flange 8 and is a substantially plate-shaped member extending horizontally. The projection portion 8B is a portion projecting downward from a surface of the body portion 8A. The projection portion 8B serves as a connection portion for connecting the spring 10 described later. The spring 10 is connected to the outer periphery of the projection portion 8B.

The flange 8 in Embodiment 1 is made from one member by cutting or the like. That is, the body portion 8A and the projection portion 8B are formed so as to be integrated with each other.

The through hole 8C of the flange 8 is a hole for inserting the coaxial cables 6 therethrough. The through hole 8C is formed over the overall length of the flange 8, in the thickness direction, including the body portion 8A and the projection portion 8B. The through hole 8C in Embodiment 1 has a substantially cylindrical shape having a uniform diameter along an axial direction A of the coaxial cables 6. Similarly, the projection portion 8B also has a substantially cylindrical shape having a uniform inner diameter and a uniform outer diameter. With such a shape, it is possible to easily form the flange 8.

The spring 10 is an elastic body connecting the flange 8 and the plunger 4. The spring 10 include a non-close winding portion 10A and close winding portions 10B and 10C. A center portion of the spring 10 is the non-close winding portion 10A, and both end portions of the spring 10 are the close winding portions 10B and 10C.

As shown in FIG. 3, etc., the close winding portion 10B, which is the upper end portion of the spring 10, is press-fitted and fixed to the outer periphery of the projection portion 8B of the flange 8. On the other hand, the close winding portion 10C, which is the lower end portion of the spring 10, is press-fitted and fixed to the outer periphery of the connection portion 4B of the plunger 4. In this manner, the spring 10 is directly fixed to the flange 8 and the plunger 4.

With such a configuration, since the spring 10 is elastically deformable, the spring 10 is able to perform a function to align the positions of the terminals of the multipolar connector 3 in fitting the multipolar connector 3 to the plunger 4. In particular, the spring 10 is three-dimensionally and elastically deformable and is able to align the positions of the terminals not only in the front, rear, left, right, up, and down directions but also in a circumferential direction θ, and thus is able to rapidly align the terminals of the multipolar connector 3 with high accuracy.

The spring 10 in Embodiment 1 receives only the weight of the plunger 4 in a non-fitted state before the multipolar connector 3 is fitted to the plunger 4, and is not compressed in the axial direction A of the coaxial cables 6. The length of the spring 10 in the non-fitted state is slightly longer than the natural length of the spring 10 due to the weight of the plunger 4.

As described above, the flexural rigidity k1 of each coaxial cable 6 is set to be lower than the flexural rigidity k2 of the spring 10 in Embodiment 1. Accordingly, when the same load is applied to the spring 10 and the coaxial cables 6, the coaxial cables 6 more easily elastically deform than the spring 10.

The probe pins 18 are substantially needle-shaped members that are brought into contact with the terminals of the multipolar connector 3 and electrically conducted thereto. The probe pins 18 are contained in the fitting portion 4A of the plunger 4. In Embodiment 1, two probe pins 18 are provided in corresponding relation to the two coaxial cables 6, respectively, but the number of probe pins 18 is not limited thereto.

As shown in FIG. 5, ends of the probe pins 18 are located near cavities 28 provided in the recess 17 of the fitting portion 4A of the plunger 4. The cavities 28 are provided in an end of the fitting portion 4A of the plunger 4.

The measurement connectors 12 shown in FIG. 1 are connectors for connecting the coaxial cables 6 to an external measuring instrument (not shown). In Embodiment 1, two measurement connectors 12 are provided in corresponding relation to the two coaxial cables 6, respectively.

Figure 6:
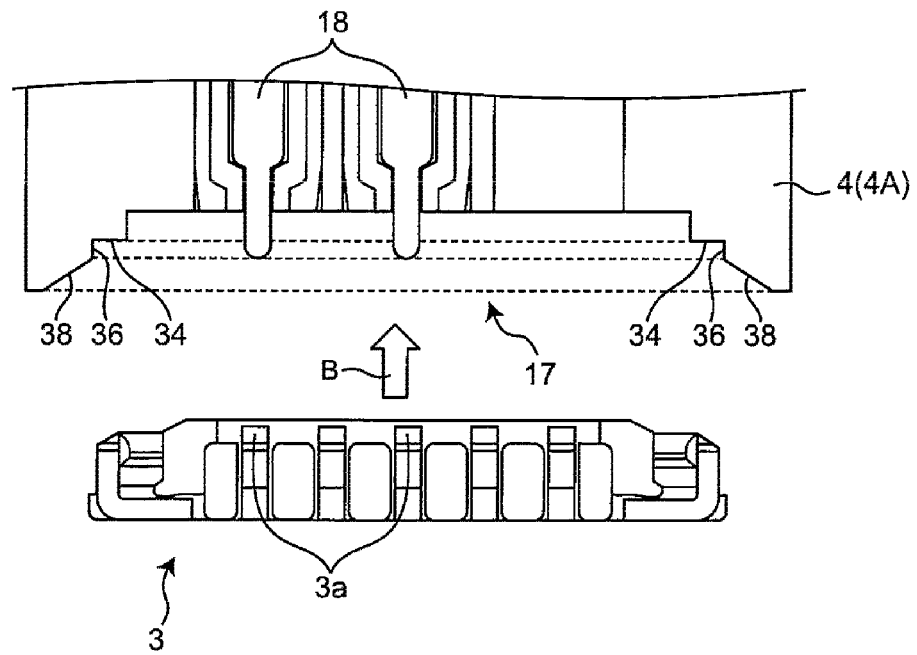
FIG. 6 is a schematic vertical cross-sectional view showing operation of placing a multipolar connector in a recess.

Next, the relationship between the probe pins 18 and the terminals of the multipolar connector 3 will be described with reference to FIG. 6. FIG. 6 a schematic vertical cross-sectional view of an area around the ends of the probe pins 18.

As shown in FIG. 6, the multipolar connector 3 is provided with a plurality of terminals 3a. The positions of the probe pins 18 are set such that, when the multipolar connector 3 is placed in the recess 17, the ends of the probe pins 18 are contactable with the terminals 3a. Accordingly, it is possible to simultaneously bring the plurality of probe pins 18 into contact with the plurality of terminals 3a of the multipolar connector 3 and simultaneously inspect characteristics of the terminals 3a.

The recess 17 in Embodiment 1 is formed by a bottom wall 34, a first side wall 36, and a second side wall 38 of the plunger 4. The bottom wall 34 is a wall portion of the plunger 4 that forms the bottom surface of the recess 17. The first side wall 36 is a side wall that rises from the periphery of the bottom wall 34 so as to be orthogonal to the bottom wall 34. The second side wall 38 is a side wall that rises from the periphery of the first side wall 36. The second side wall 38 in Embodiment 1 extends in a direction away from the first side wall 36 so as to spread radially outward. The second side wall 38 having such a shape serves as a guide portion that guides the multipolar connector 3 to the inside of the recess 17.

Figure 7:
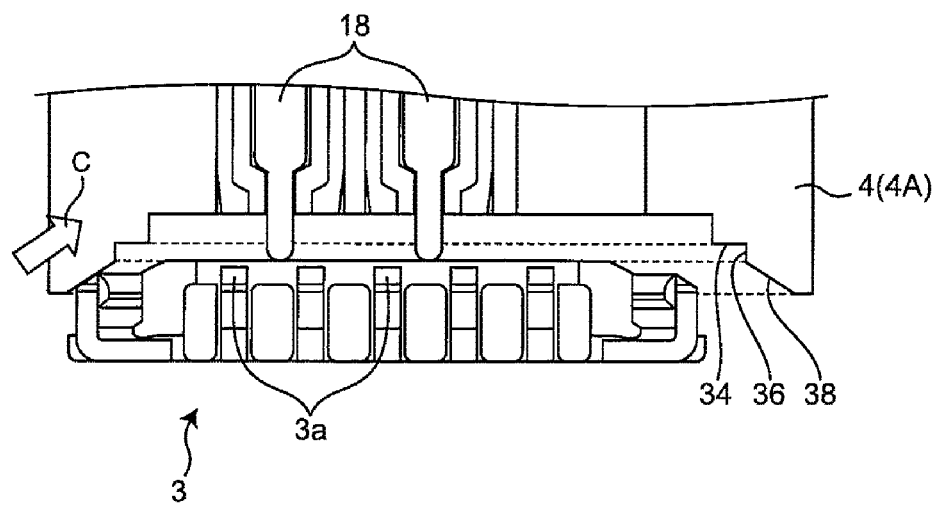
FIG. 7 is a schematic vertical cross-sectional view showing operation of placing the multipolar connector in the recess.
Figure 8:
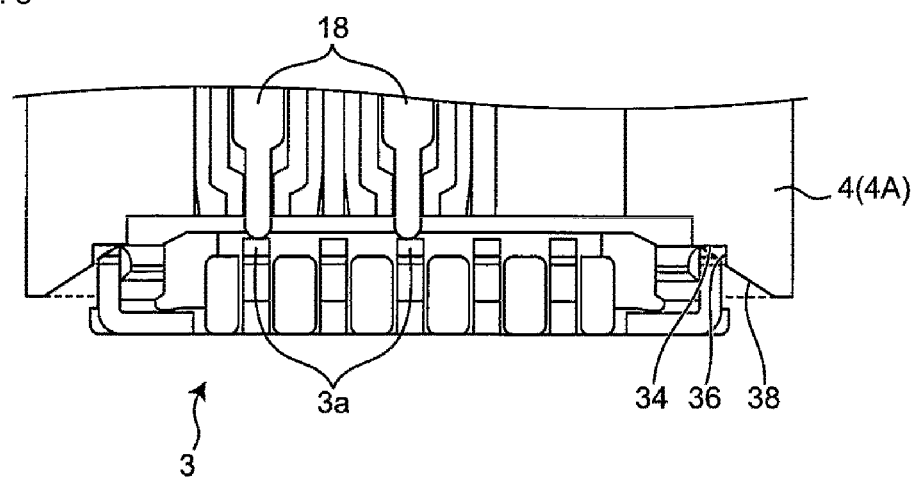
FIG. 8 is a schematic vertical cross-sectional view showing operation of placing the multipolar connector in the recess.

The method for placing the multipolar connector 3 in the recess 17 and inspecting characteristics of the terminals 3a will be described with reference to FIGS. 6, 7, and 8. FIGS. 7 and 8 are each a schematic vertical cross-sectional view showing operation of placing the multipolar connector 3 in the recess 17.

As shown in FIG. 6, first, the multipolar connector 3 is caused to be close to the recess 17 (an arrow B). Accordingly, the multipolar connector 3 starts contact with the second side wall 38 of the plunger 4 as shown in FIG. 7 (the left side in the drawing).

As described above, the second side wall 38 has a substantially tapered shape inclined so as to be narrower inwardly. Accordingly, the multipolar connector 3 that has been in contact with the second side wall 38 is guided toward the inside of the recess 17 (an arrow C).

At this time, as a result of the contact with the multipolar connector 3, force to compress and deform the plunger 4 and the spring 10 fixed to the plunger 4 is applied to the plunger 4 and the spring 10.

Figure 9:
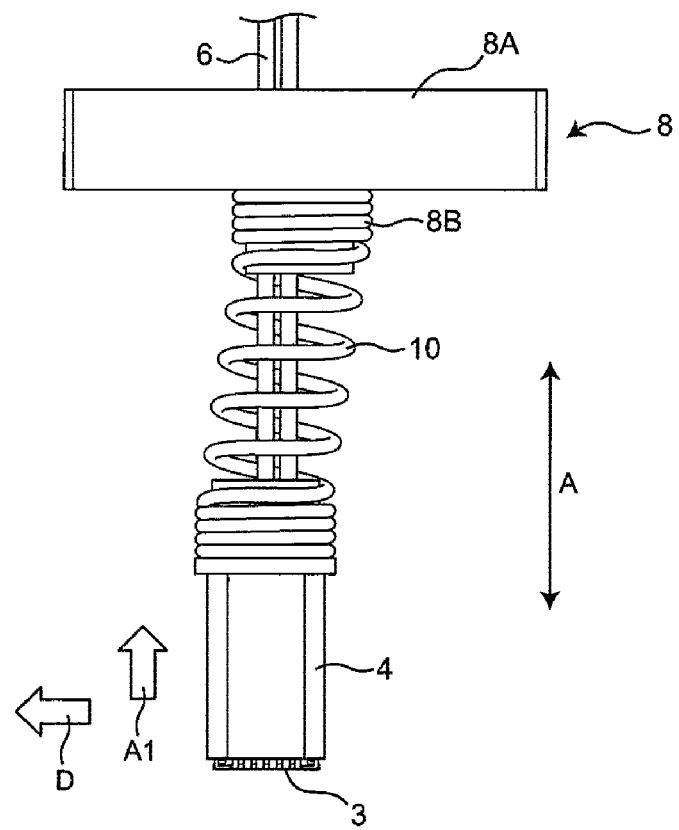
FIG. 9 is a side view of a state where the multipolar connector is fitted to the recess of a plunger.

As described above, the spring 10 is three-dimensionally deformable, and is deformable not only in the axial direction A, but also in a direction crossing the axial direction A. As shown in FIG. 9, the spring 10 is compressed to deform along the axial direction A (an arrow A1), and also deforms in the horizontal direction (an arrow D). Furthermore, the spring 10 also deforms in the circumferential direction θ (FIG. 3). By deforming as described above, the spring 10 is able to rapidly align the positions of the terminals 3a of the multipolar connector 3 and the positions of the probe pins 18 with each other with high accuracy.

Finally, as shown in FIG. 8, the multipolar connector 3 is positioned at a predetermined measurement position in the recess 17. More specifically, the multipolar connector 3 is placed at a position surrounded by the bottom wall 34 and the first side wall 36. By the probe pins 18 coming into contact with the terminals 3a of the multipolar connector 3, the coaxial cables 6 are conducted to the plurality of terminals 3a of the multipolar connector 3 via the probe pins 18, so that it is possible to simultaneously inspect characteristics of the respective terminals 3a.

As described above, by simultaneously bringing the plurality of probe pins 18 into contact with the plurality of terminals 3a of the multipolar connector 3, it is possible to simultaneously inspect characteristics of the plurality of terminals 3a. Accordingly, it is possible to simultaneously measure a plurality of signals.

In Embodiment 1, particularly, the flange 8 and the plunger 4 are directly fixed by the spring 10. Due to such a configuration, whereas a simple structure is adopted, it is possible to align the positions of the terminals 3a of the multipolar connector 3 and the positions of the probe pins 18 with each other with high accuracy by elastic deformation of the spring 10. Accordingly, it is possible to inspect characteristics of the terminals 3a of the multipolar connector 3 with high accuracy.

Furthermore, since the flange 8 and the plunger 4 are directly fixed by the spring 10, it is possible to deform the spring 10 immediately after the multipolar connector 3 is fitted to the plunger 4, and it is further possible to rapidly align the position of the multipolar connector 3.

Figure 10:
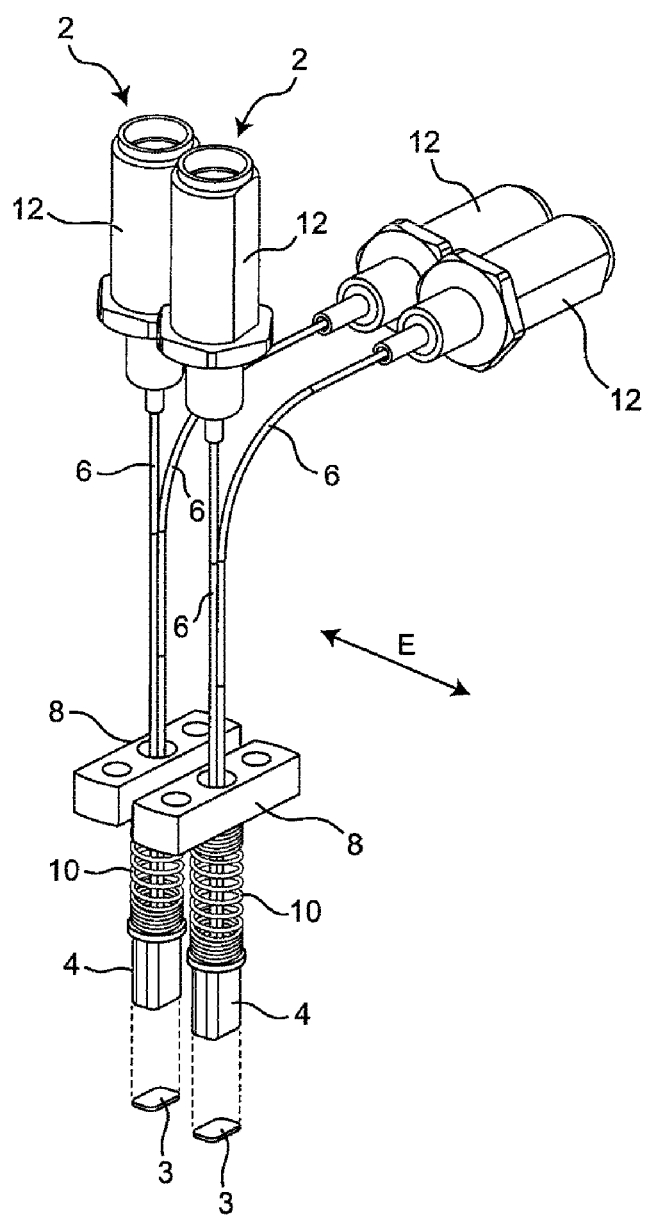
FIG. 10 is a schematic perspective view showing a state where a plurality of the probes in FIG. 1 are arranged.

Since the flange 8 and the spring 10 are directly connected to each other, it is not necessary to provide another connection member (housing) for connecting the flange 8 and the spring 10. Thus, the width of the flange 8 in the short direction only needs to be ensured for the size of the projection portion 8B and the through hole 8C. For example, when a plurality of probes 2 are arranged and used for a plurality of multipolar connectors 3 as shown in FIG. 10, it is possible to reduce the dimension of each flange 8 in the direction in which the flanges 8 are arranged (an arrow E), and thus it is possible to arrange more probes 2.

As described above, the probe 2 according to Embodiment 1 is a probe for inspecting characteristics of the terminals of the multipolar connector 3 and includes the flange 8, the coaxial cables 6, the plunger 4, and the spring 10. The flange 8 is a member having the through hole 8C and used for mounting the probe 2 to a facility. Each coaxial cable 6 is a member that is inserted through the through hole 8C of the flange 8 and extends in the axial direction A, and has an end portion at which the probe pins 18 are mounted. The plunger 4 is a member that contains the probe pins 18 and has the recess 17 for fitting the multipolar connector 3 and in which the probe pins 18 are exposed in the recess 17. The spring 10 is a member that contains the coaxial cables 6 between the flange 8 and the plunger 4 and has one end portion (the close winding portion 10B) fixed to the flange 8 and another end portion (the close winding portion 10C) fixed to the plunger 4.

With such a configuration, when the multipolar connector 3 is fitted to the recess 17 of the plunger 4, pressing force is generated in the plunger 4 and the spring 10 elastically deforms. The spring 10 is deformable not only in the axial direction A but also in the direction crossing the axial direction A, and thus it is possible to more accurately align the positions of the terminals 3a of the multipolar connector 3 and the positions of the probe pins 18 with each other. Accordingly, it is possible to more accurately inspect characteristics of the terminals 3a of the multipolar connector 3.

In the probe 2 according to Embodiment 1, the flexural rigidity k1 of each coaxial cable 6 is set to be lower than the flexural rigidity k2 of the spring 10. With such a configuration, when the spring 10 elastically deforms, the coaxial cables 6 easily elastically deform, and thus elastic deformation of the spring 10 is not disturbed. Accordingly, it is possible to more accurately inspect characteristics of the terminals 3a of the multipolar connector 3.

In the probe 2 according to Embodiment 1, the through hole 8C of the flange 8 has a substantially cylindrical shape having a uniform diameter. With such a configuration, it is possible to more easily form the through hole 8C than in the case with another shape.

In the probe 2 according to Embodiment 1, the flange 8 further includes the tubular projection portion 8B that projects so as to extend the through hole 8C toward the spring 10. The spring 10 is press-fitted and fixed to the outer periphery of the projection portion 8B. With such a configuration, it is possible to fix the flange 8 and the spring 10 to each other with a simpler configuration.

In the probe 2 according to Embodiment 1, the projection portion 8B has a substantially cylindrical shape having a uniform inner diameter and a uniform outer diameter. With such a configuration, it is possible to easily form the projection portion 8B as compared to the case with another shape.

In the probe 2 according to Embodiment 1, in a non-fitted state where the plunger 4 is not fitted to the multipolar connector 3, the length of the spring 10 is equal to or larger than the natural length of the spring 10. As described above, since the spring 10 is equal to or longer than the natural length of the spring 10 in a non-fitted state where the plunger 4 is not fitted to the multipolar connector 3, it is possible to achieve, for example, a configuration to support the weight of the plunger 4 only by the spring 10, as compared to a configuration in which the spring 10 is compressed to be shorter than the natural length of the spring 10.

In the probe 2 according to Embodiment 1, the spring 10 has the close winding portions 10B and 10C at both end portions thereof. With such a configuration, it is possible to more firmly fix the spring 10. In addition, since deformation of the close winding portions 10B and 10C is suppressed as compared to that of the non-close winding portion 10A at the center portion. Thus, it is possible to more easily deform the spring 10 in a desired direction along the axial direction A.

In the probe 2 according to Embodiment 1, the wall portion of the plunger 4 for forming the recess 17 includes the bottom wall 34, the first side wall 36, and the second side wall 38. The second side wall 38 rises from the periphery of the first side wall 36 and is also inclined toward the first side wall 36 so as to be narrower inwardly. With such as configuration, it is possible to guide the multipolar connector 3 to the inside of the recess 17 along the second side wall 38 when fitting the multipolar connector 3 to the recess 17 of the plunger 4.

Embodiment 2

A probe 40 according to Embodiment 2 of the present disclosure will be described with reference to FIGS. 11 to 13. In Embodiment 2, the differences from Embodiment 1 will be mainly described. In addition, identical or equivalent components are designated by the same reference signs and the description thereof is omitted.

Figure 11:
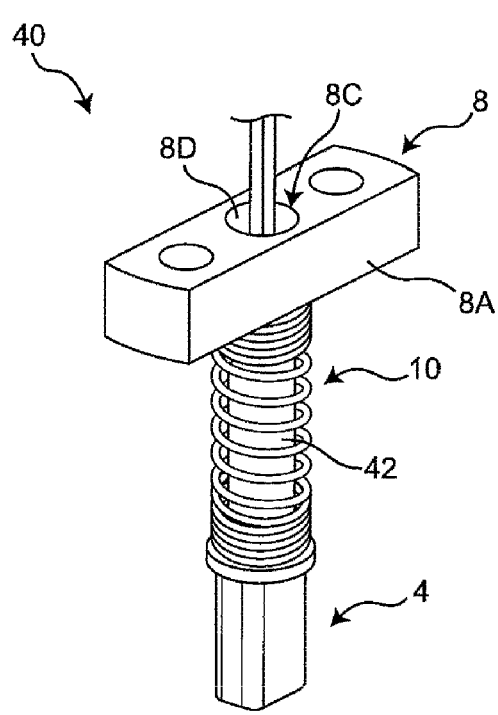
FIG. 11 is a schematic perspective view of a probe according to Embodiment 2.
Figure 12:
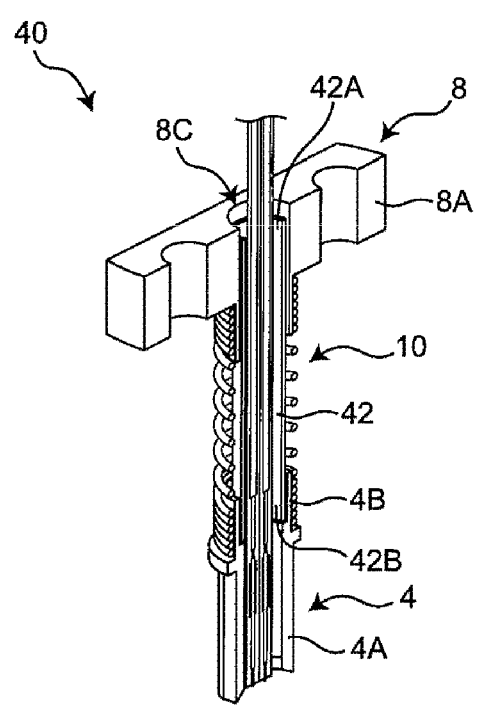
FIG. 12 is a schematic perspective view showing a cross-section of the probe in FIG. 11 taken in the vertical direction.
Figure 13:
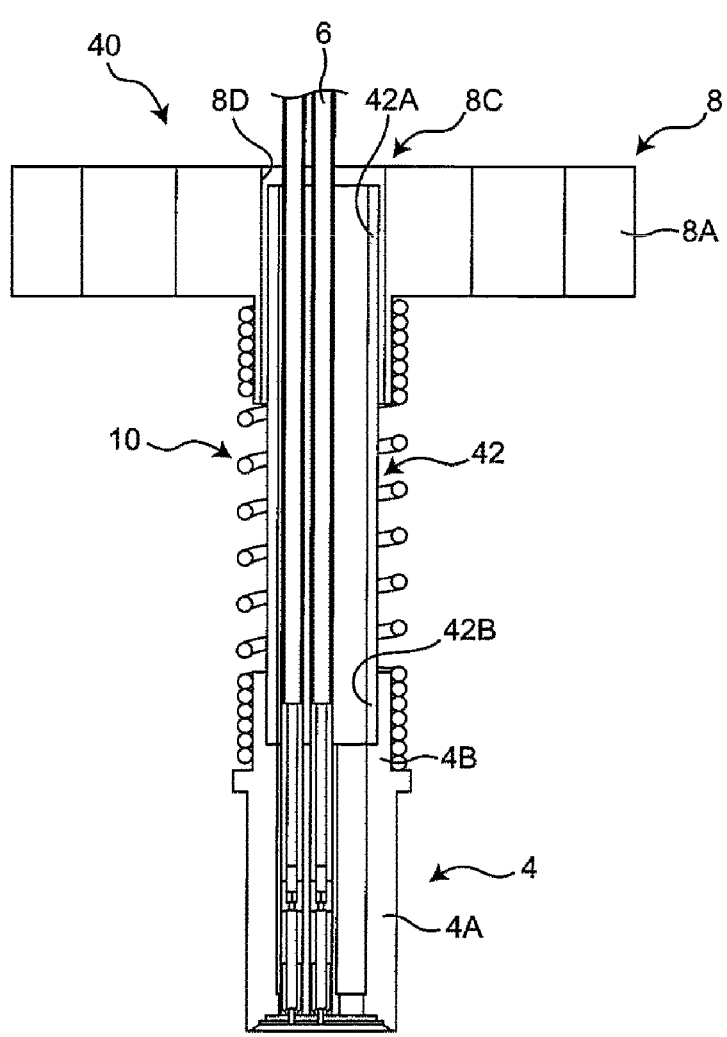
FIG. 13 is a vertical cross-sectional view of the probe in FIG. 11.

FIG. 11 is a partially enlarged schematic perspective view of the probe 40 according to Embodiment 2, FIG. 12 is a schematic perspective view showing a cross-section of the probe 40 in FIG. 11 taken in the vertical direction, and FIG. 13 is a vertical cross-sectional view of the probe 40 in FIG. 11.

The probe 40 according to Embodiment 2 is different from the probe 2 according to Embodiment 1 in that a tubular member 42 is further provided as a new component.

The tubular member 42 is a tubular member arranged between the spring 10 and the coaxial cables 6. The tubular member 42 has a function to inhibit excessive deformation of the spring 10. As shown in FIGS. 12 and 13, the tubular member 42 contains the coaxial cables 6 and is also arranged so as to be spaced apart from both the spring 10 and the coaxial cables 6.

An upper end portion 42A of the tubular member 42 is inserted through the through hole 8C of the flange 8. The upper end portion 42A of the tubular member 42 is arranged so as to be spaced apart from an inner circumferential surface 8D of the flange 8 that forms the through hole 8C. With such arrangement, the tubular member 42 is movable within the through hole 8C of the flange 8 only until coming into contact with the inner circumferential surface 8D.

Meanwhile, a lower end portion 42B of the tubular member 42 is connected to the connection portion 4B of the plunger 4. The lower end portion 42B in Embodiment 2 is press-fitted and fixed to the inner periphery of the connection portion 4B. With such arrangement, the tubular member 42 moves integrally with the plunger 4 in accordance with movement of the plunger 4.

Since such a tubular member 42 is provided, when the multipolar connector 3 fits to the plunger 4 and the spring 10 deforms, the tubular member 42 moves simultaneously with the deformation of the spring 10. When the upper end portion 42A of the tubular member 42 comes into contact with the inner circumferential surface 8D of the flange 8, movement of the tubular member 42 is restricted. With the restriction of movement of the tubular member 42, deformation of the spring 10, which is fixed to the plunger 4, is also restricted. In this manner, it is possible to inhibit excessive deformation of the spring 10.

As described above, the probe 40 according to Embodiment 2 further includes, between the spring 10 and the coaxial cables 6, the tubular member 42 containing the coaxial cables 6. Since such a tubular member 42 is provided, when the spring 10 elastically deforms, it is possible to inhibit the spring 10 from deforming more than necessary.

In the probe 40 according to Embodiment 2, the tubular member 42 is inserted through the through hole 8C so as to be spaced apart from the inner circumferential surface 8D, which forms the through hole 8C of the flange 8, and is press-fitted and fixed to the connection portion 4B of the plunger 4. With such a configuration, since the tubular member 42 is not fixed to the flange 8, it is possible to ensure a state where the tubular member 42 is movable. Furthermore, since the tubular member 42 is press-fitted and fixed to the plunger 4, it is possible to easily arrange the tubular member 42 such that the tubular member 42 is movable integrally with the plunger 4.

Although the present disclosure has been described above by means of Embodiments 1 and 2, the present disclosure is not limited to Embodiments 1 and 2 described above.

Although the present disclosure has been fully described by way of preferred embodiments with reference to the accompanying drawings, various changes and modifications would be apparent to those skilled in the art. Unless such changes and modifications otherwise depart from the scope of the present disclosure as set forth in the appended claims, they should be construed as being included therein. In addition, the combination and order of the elements in the respective embodiments may be changed without departing from the scope and the spirit of the present disclosure.

Any embodiments of various Embodiments 1 and 2 described above may be combined as appropriate, thereby achieving the advantageous effects of the respective embodiments.

The present disclosure is applicable to any probe for inspecting characteristics of terminals of a multipolar connector.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A probe for inspecting characteristics of a terminal of a multipolar connector, the probe comprising:
    a flange having a through hole and serving to mount the probe to a facility;
    a coaxial cable inserted through the through hole, extending in an axial direction, and having an end portion at which a probe pin is mounted;
    a plunger containing the probe pin and having a recess for fitting the multipolar connector, the probe pin being exposed in the recess; and
    a spring containing the coaxial cable between the flange and the plunger, and having an end portion fixed to the flange and another end portion fixed to the plunger;
    wherein the coaxial cable has flexural rigidity set to be lower than that of the spring.

2. The probe according to claim 1, further comprising:
    a tubular member containing the coaxial cable, between the spring and the coaxial cable.

3. The probe according to claim 2, wherein
    the tubular member is inserted through the through hole so as to be spaced apart from an inner circumferential surface forming the through hole of the flange, and is press-fitted and fixed to the plunger.

4. The probe according to claim 2, wherein
    the through hole of the flange has a substantially cylindrical shape having a uniform diameter.

5. The probe according to claim 2, wherein
    the flange further includes a tubular projection portion projecting so as to extend the through hole toward the spring, and
    the spring is press-fitted and fixed to an outer periphery of the projection portion.

6. The probe according to claim 2, wherein
    in a non-fitted state where the plunger is not fitted to the multipolar connector, a length of the spring is equal to or larger than a natural length of the spring.

7. The probe according to claim 2, wherein
    the spring has close winding portions at both end portions thereof.

8. The probe according to claim 1, wherein
    the through hole of the flange has a substantially cylindrical shape having a uniform diameter.

9. The probe according to claim 1, wherein
    the flange further includes a tubular projection portion projecting so as to extend the through hole toward the spring, and
    the spring is press-fitted and fixed to an outer periphery of the projection portion.

10. The probe according to claim 9, wherein
the projection portion has a substantially cylindrical shape having a uniform inner diameter and a uniform outer diameter.

11. The probe according to claim 1, wherein
in a non-fitted state where the plunger is not fitted to the multipolar connector, a length of the spring is equal to or larger than a natural length of the spring.

12. The probe according to claim 1, wherein
the spring has close winding portions at both end portions thereof.

13. The probe according to claim 1, wherein
the plunger includes a wall portion that forms the recess, and
the wall portion includes a bottom wall that exposes an end portion of the probe pin, a first side wall that rises from a periphery of the bottom wall, and a second side wall that rises from a periphery of the first side wall and is inclined toward the first side wall so as to be narrower inward.

14. The probe according to claim 1, further comprising:
a tubular member containing the coaxial cable, between the spring and the coaxial cable.

15. The probe according to claim 1, wherein
the through hole of the flange has a substantially cylindrical shape having a uniform diameter.

16. The probe according to claim 1, wherein
the flange further includes a tubular projection portion projecting so as to extend the through hole toward the spring, and
the spring is press-fitted and fixed to an outer periphery of the projection portion.

17. The probe according to claim 1, wherein
in a non-fitted state where the plunger is not fitted to the multipolar connector, a length of the spring is equal to or larger than a natural length of the spring.

18. The probe according to claim 1, wherein
the spring has close winding portions at both end portions thereof.

19. The probe according to claim 1, wherein
the plunger includes a wall portion that forms the recess, and
the wall portion includes a bottom wall that exposes an end portion of the probe pin, a first side wall that rises from a periphery of the bottom wall, and a second side wall that rises from a periphery of the first side wall and is inclined toward the first side wall so as to be narrower inward.

20. A probe for inspecting characteristics of a terminal of a multipolar connector, the probe comprising: a flange having a through hole and serving to mount the probe to a facility; a coaxial cable inserted through the through hole, extending in an axial direction, and having an end portion at which a probe pin is mounted; a plunger containing the probe pin and having a recess for fitting the multipolar connector, the probe pin being exposed in the recess; and a spring containing the coaxial cable between the flange and the plunger, and having an end portion fixed to the flange and another end portion fixed to the plunger; wherein the spring has a close winding portion at each of first and second end portions thereof, and a non-close winding portion between the close winding portions: wherein the coaxial cable has flexural rigidity set to be lower than that of the spring.

21. The probe according to claim 20, wherein
the flange has a projection portion for fixing the spring;
the plunger has a connection portion for fixing the spring;
the first end portion of the spring is press-fitted and fixed to an outer circumference of the projection portion; and
the second end portion of the spring is press-fitted and fixed to an outer circumference of the connection portion.

* * * * *